United States Patent [19]

Rogers

[11] Patent Number: 4,897,738

[45] Date of Patent: Jan. 30, 1990

[54] CIRCUIT FOR GENERATING A FREQUENCY-MODULATED SIGNAL INDICATIVE OF DATA TO BE RECORDED ONTO MAGNETIC TAPE

[75] Inventor: Michael J. Rogers, Bristol, England

[73] Assignee: Thorn EMI Datatech Limited, Feltham, England

[21] Appl. No.: 153,343

[22] Filed: Feb. 8, 1988

[30] Foreign Application Priority Data

Feb. 18, 1987 [GB] United Kingdom ............... 8703769

[51] Int. Cl.[4] ........................ G11B 27/06; G11B 5/02
[52] U.S. Cl. .......................................... 360/30; 360/68
[58] Field of Search ................... 360/30, 67, 68, 73.01, 360/73.05, 73.08

[56] References Cited

U.S. PATENT DOCUMENTS

| 3,702,382 | 11/1972 | Breikss | 360/73.05 |
| 3,900,890 | 8/1975 | Eibner | 360/73.05 |

FOREIGN PATENT DOCUMENTS

| 0182701 | 5/1986 | European Pat. Off. | 360/30 |
| 2730595 | 1/1978 | Fed. Rep. of Germany | 360/30 |
| 514330 | 2/1975 | U.S.S.R. | 360/67 |

Primary Examiner—Vincent P. Canney
Attorney, Agent, or Firm—Fleit, Jacobson, Cohn, Price, Holman & Stern

[57] ABSTRACT

A circuit for generating frequency-modulated signals for data to be recorded on magnetic tape has a converter to produce a control current $I_c$ for a capacitor C. A detection logic circuit senses voltage $V_c$ across the capacitor C and generates an appropriate frequency f which is fed to a charge pump, for discharging of capacitor C by a predetermined amount at a rate dependent on the frequency f. Control current $I_c$ then charges capacitor C again and the cycle is repeated. A starter circuit is also provided to ensure that the circuit oscillates on each cycle.

4 Claims, 4 Drawing Sheets

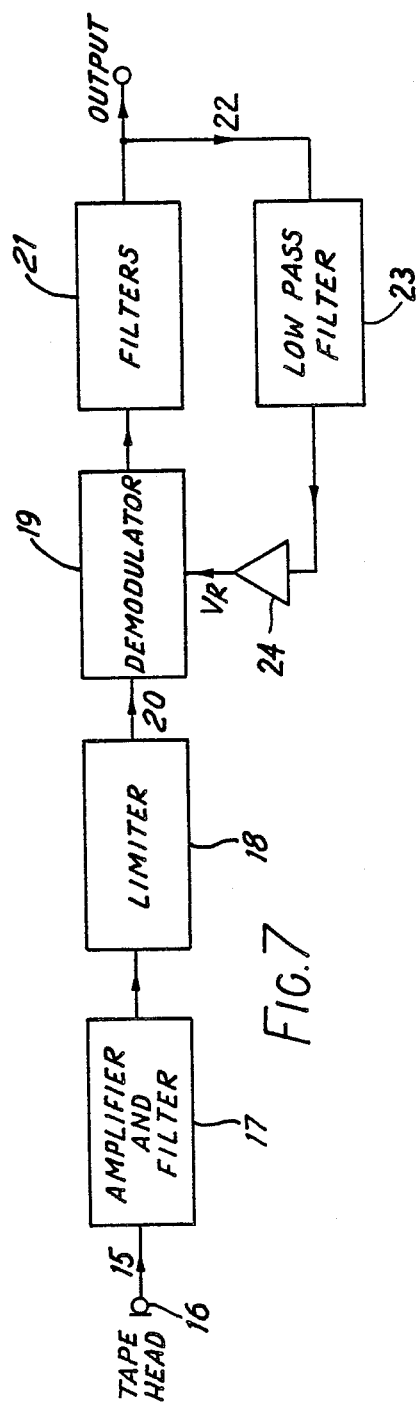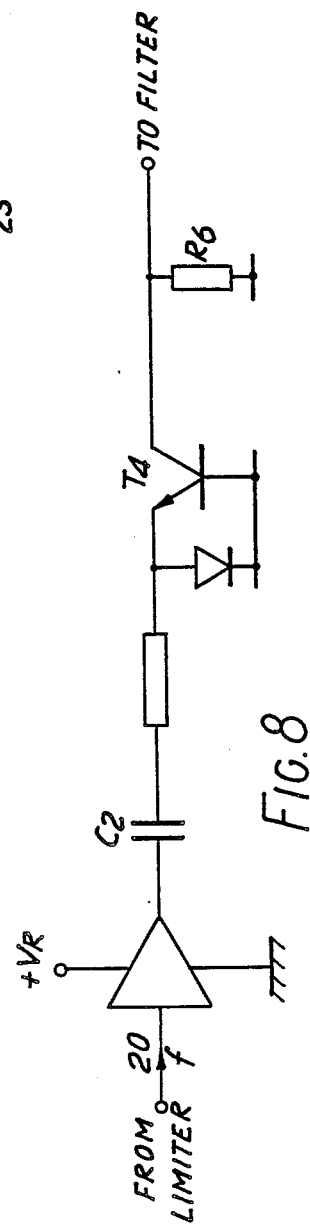

CIRCUIT FOR GENERATING A FREQUENCY-MODULATED SIGNAL INDICATIVE OF DATA TO BE RECORDED ONTO MAGNETIC TAPE

BACKGROUND OF INVENTION

This invention relates to a circuit for generating a frequency-modulated signal and in particular for generating such a signal indicative of data to be recorded on magnetic tape.

It is usual practice in frequency-modulated data recording to render the centre frequency of the frequency-modulated carrier signal proportional to the tape speed selected for recording.

Generally, the selectable tape speeds bear a binary relationship to one another, so that the frequency of the carrier signal corresponding to the selected tape speed can be provided by binary division of the frequency of the generated signal.

However, it has been found that simple binary division of the frequency may not provide a sufficiently accurate correlation between the frequency and tape speed, particularly in certain applications where an intermediate or a continuously variable tape speed is utilised.

SUMMARY INVENTION

It is therefore an object of the present invention to provide a circuit for generating a frequency-modulated signal indicative of data to be recorded on magnetic tape, which circuit achieves a more accurate correlation between frequency of the signal and tape speed than that achieved by known circuits for this purpose.

Accordingly, the present invention provides a circuit for generating a frequency-modulated signal indicative of data to be recorded onto magnetic tape, said circuit including charge storage means, means for charging said charge storage means in dependence on an input voltage, means for generating an output signal of frequency dependent on the voltage across said charge storage means, means for discharging said charge storage means, means for sensing the speed of said tape, and means for varying the amount by which said charge storage means is discharged in dependence on the sensed tape speed.

In a preferred embodiment, a voltage level to which the charge storage means is discharged is variable, in dependence on the sensed tape speed, and a voltage level from which the charge storage means is discharged remains fixed.

The present invention therefore provides continuous fine adjustment of the frequency of the carrier signal, in dependence on the actual tape speed.

The present invention is preferably used in conjunction with a coarse frequency adjustment employing integral division of the carrier frequency, by for example binary division, thereby reducing the necessary range of the fine adjustment.

BRIEF DESCRIPTION OF THE DRAWINGS

The invention will now be further described by way of example only with reference to the accompanying drawings, wherein:

FIGS. 7 and 8 show a demodulating circuit incorporating features of the present invention.

DESCRIPTION OF PREFERRED EMBODIMENT

Figure 1:
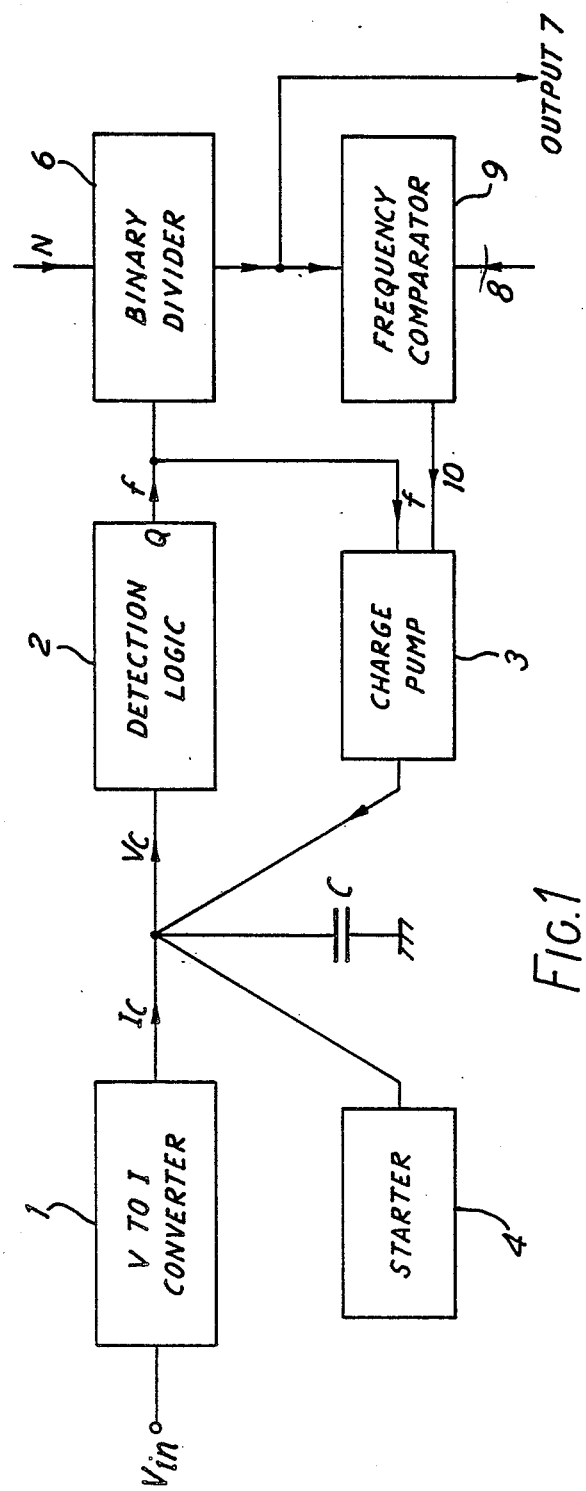
FIG. 1 shows a block circuit diagram of a preferred embodiment of the invention.

In FIG. 1, a V to I converter 1 converts input voltage $V_{in}$ to a control current $I_c$, which is fed to a capacitor C. A detection logic circuit 2 senses voltage $V_c$ across the capacitor C and generates a frequency f, indicative of voltage $V_c$, at its output Q. The frequency f is fed to a charge pump 3, which discharges capacitor C by a predetermined amount at a rate dependent on the frequency f. Control current $I_c$ then charges capacitor C again and the cycle is repeated. A starter circuit 4 is also provided to ensure that the circuit oscillates on each cycle. The circuit, as briefly described, can thus be seen to operate in accordance with the known "charge-balance" principle.

Figure 2:
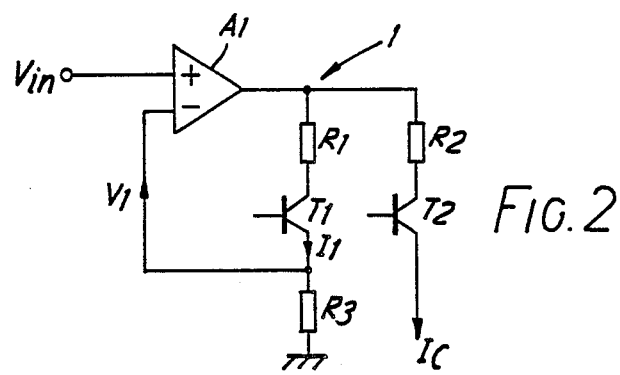
FIGS. 2 to 5 show circuit component diagrams for each of the block circuits in FIG. 1.

The V to I converter 1, as shown in more detail in FIG. 2, includes two equal resistors $R_1$ and $R_2$ connected respectively to transistors $T_1$ and $T_2$. An amplifier $A_1$ ensures voltage $V_1$ is equal to the input voltage $V_{in}$, and therefore input voltage $V_{in}$ is also equal to $I_1 R_3$, where $I_1$ is the current passing through transistor $T_1$ and resistor $R_3$. Since resistors $R_1$ and $R_2$ are equal, the output current $I_c$ of the converter 1 is equal to current $I_1$, and is therefore also equal to $V_{in}/R_3$. The output current $I_c$ is therefore proportional to input voltage $V_{in}$.

Figure 3:
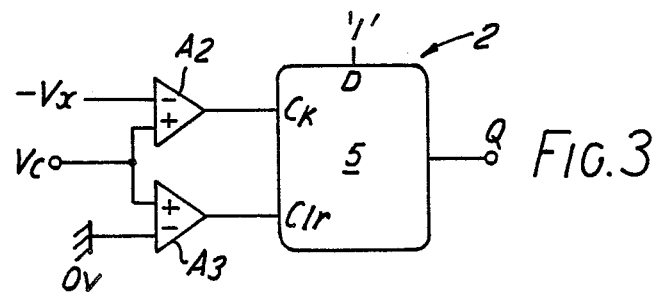

The current $I_c$ is fed to the capacitor C, as shown in FIG. 1, and the voltage $V_c$ across capacitor C is sensed by detection logic circuit 2, which is shown in more detail in FIG. 3.

The sensed voltage $V_c$ is applied to the non-inverting inputs of two high-speed, low-bias comparators $A_2$ and $A_3$, comparator $A_2$ having a reference voltage of $-V_x$ and comparator $A_3$ having a reference voltage of 0V.

Figure 6:
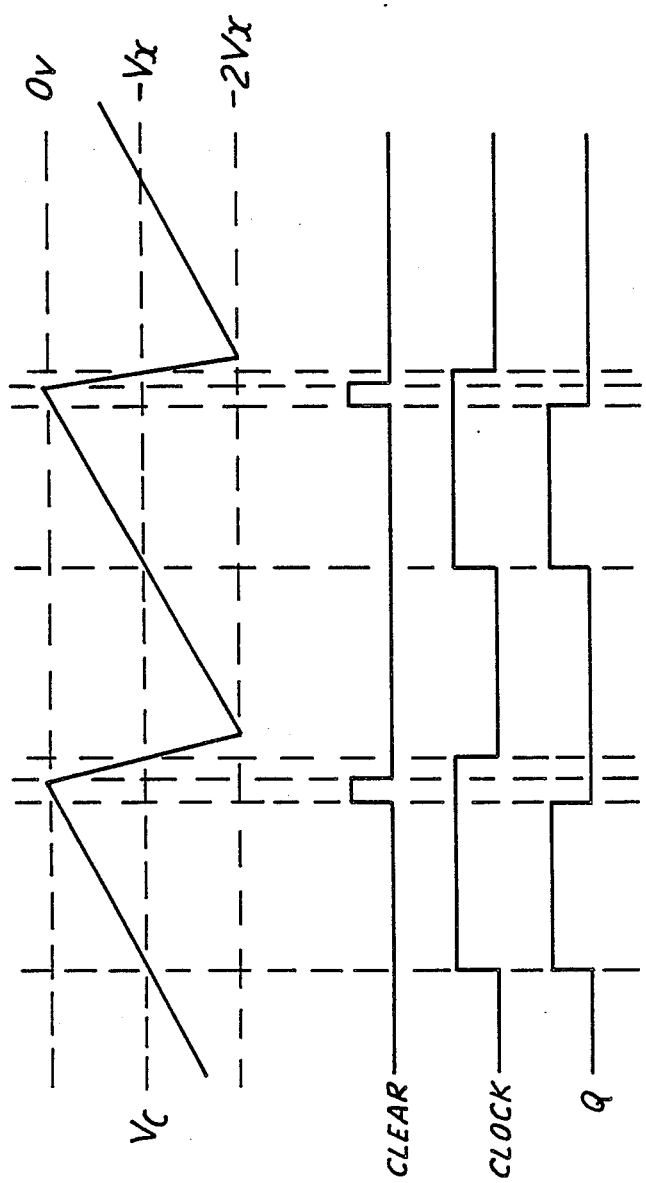
FIG. 6 shows a waveform diagram for the circuit.

Referring now also to FIG. 6, which shows a waveform of voltage $V_c$, comparator $A_3$ is biased to apply a "clear" to a D-type flip-flop 5, whenever voltage $V_c$ exceeds 0V, and comparator $A_2$ is biased to clock a "1" into flip-flop 5 whenever voltage $V_c$ crosses reference $-V_x$ in the positive-going direction. Output Q of the logic circuit 2 is then passed to charge pump 3.

Figure 4:
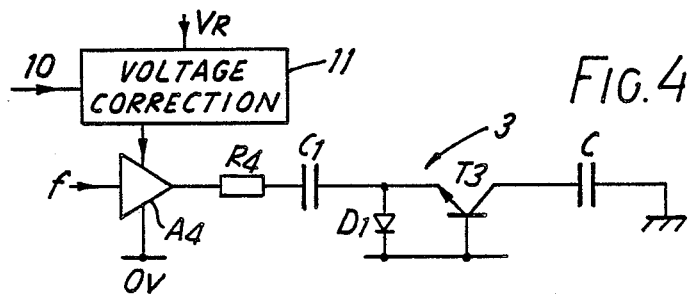

Charge pump 3, as shown in detail in FIG. 4, includes an amplifier $A_4$ which switches the input voltage between 0 and $+V_r$ volts at frequency f. On positive transitions of the input voltage from 0 to $+V_r$ volts, a charging current for capacitor $C_1$ flows through diode $D_1$ and no current flows through transistor $T_3$. On negative transitions of the input voltage from $+V_r$ to 0 volts, the charging current for capacitor $C_1$ flows through transistor $T_3$ and discharges capacitor C, shown in FIG. 1, by a predetermined amount, so that the voltage $V_c$ across capacitor C drops to approximately $-2V_x$, thereby making the waveform of output Q substantially symmetrical.

Resistor $R_4$ in charge pump 3 limits the current through the circuit to prevent transistor $T_3$ from saturating. Capacitor $C_1$ preferably has a temperature coefficient, which cancels any temperature variations in the voltages of diode $D_1$ and transistor $T_3$, so that the charge on capacitor $C_1$ remains substantially constant with temperature. Voltage $V_r$ is a constant regulated voltage and amplifier $A_4$ is preferably a CMOS inverter, which has no inherent voltage drop and only an output resistance which can be added to that of resistor $R_4$. Time constant $C_1 R_4$ is chosen to be sufficiently short to enable capacitor $C_1$ to charge with sufficient accuracy when the frequency f is relatively high.

Once the charge pump 3 has discharged capacitor C so that the voltage thereacross has dropped to approximately $-2V_x$, the control current $I_c$ again charges capacitor C to a voltage $V_c$ of 0V and then the cycle is repeated.

Figure 5:
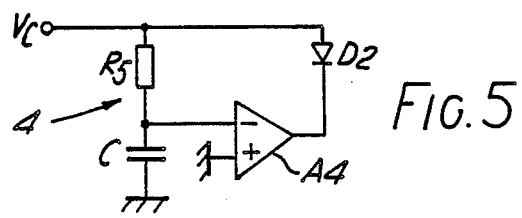

In normal operation, the voltage $V_c$ therefore oscillates between $-2V_x$ and 0V. If it has, however, an instantaneous value less than $-2V_x$, then it will ramp in the positive direction and continue oscillating. If, on the other hand, it has an instantaneous value greater than 0V, it could ramp in the positive direction until the voltage is limited by saturation of the current source and no oscillation occurs. This condition can be detected and corrected by the starter circuit 4 shown in more detail in FIG. 5.

Normally, the capacitor C has an average voltage of approximately $-V_x$ and amplifier $A_4$ saturates a positive-holding diode $D_2$. When the voltage $V_c$ goes above 0V, capacitor C charges through resistor $R_5$ until the output of amplifier $A_4$ goes negative. Due to resistor $R_5$ and capacitor $C_1$, amplifier $A_4$ is unstable and its output makes diode $D_2$ and the voltage $V_c$ go negative. When the voltage $V_c$ goes below $-2V_x$, capacitor C discharges through resistor $R_5$ until the output of amplifier $A_4$ goes positive. Diode $D_2$ is thus made non-conducting and voltage $V_c$ ramps positively into a normal oscillation cycle.

The above-described circuit is preferably employed in recording of data onto magnetic tape and, in this application, it is required to accommodate different tape speeds, which may be continuously variable.

To this end, the frequency f of output Q is rendered proportional to the selected tape speed. This is achieved partly by a binary divider circuit 6, which divides the frequency f by a number N, where N is dependent on the selected tape speed. The divided frequency is then passed via output 7 to the data recording tape (not shown), the actual speed of which is monitored by a suitable tape sensor (not shown), and a frequency signal 8 from the tape sensor, indicative of the actual tape speed, is passed to a frequency comparator 9. The comparator 9 compares the frequency signal 8 with the divided frequency signal and generates an error signal 10, which is passed to charge pump 3.

As shown in FIG. 4, the error signal 10 is passed to a voltage correction circuit 11, wherein it is used to adjust the reference voltage $V_R$.

It can be seen from FIG. 6 that, if the voltage level $-2V_x$ to which the capacitor C is discharged is made more positive, the period of the ramp is reduced and the output frequency f is increased. Conversely, if the voltage level $-2V_x$ is made more negative, the output frequency is reduced.

Consequently, by making reference voltage $V_r$ inversely proportional to the selected tape speed, the amount by which the capacitor C is discharged is varied, in dependence on the tape speed, so that the output frequency f is proportional to the actual tape speed to a relatively high degree of accuracy.

The reference voltage $-V_x$ of comparator $A_2$ can also be adjusted accordingly, so that the symmetrical waveform of output Q can be retained.

The binary divider circuit 6 is therefore used as a coarse adjustment of the output frequency, whilst the present invention provides a fine adjustment of the frequency.

Whilst this arrangement advantageously reduces the frequency range necessary for the fine adjustment, the binary divider circuit 6 may be omitted, if it is not required.

As an alternative to the automatically-controlled adjustment of the output frequency, as employed in the preferred embodiment, the adjustment may be controlled manually, in dependence on the sensed tape speed.

Therefore, by monitoring the tape speed and adjusting the amount by which the capacitor C is discharged, in accordance with the sensed tape speed, the present invention provides a correlation between tape speed and carrier frequency of greater accuracy than of known circuits for generating frequency-modulated signals.

It may be necessary to include a low-pass filter (not shown) between the frequency comparator 9 and the charge pump 3, so that output 7 can contain modulation which does not cause correction of $V_R$, whilst the carrier is made equal in frequency to the tape signal 8 (or to a multiple or sub-multiple of it). This arrangement is suitable for use in a.c. modulation, but not d.c. modulation.

For d.c. modulation, a sample-and-hold circuit (not shown), which is used in sample (or track) mode during a calibration period and in hold mode during normal operation, could be used instead of the low pass filter. The sample-and-hold circuit may be analogue or digital in form and can again be located between the comparator 9 and charge pump 3. The circuit would require calibration after any tape speed change, or in digital form it would be necessary to ascertain a new value of $V_R$.

It will be appreciated by persons skilled in the art that alternative circuit arrangements to those described may be employed for various parts, such as the V to I convertor, of the present circuit.

A situation may arise wherein a signal, which has been modulated and recorded at binary speeds, is required to be replayed at various intermediate speeds, for example where a system is used for time compression-/expansion applications and where the compression/expansion is not binary.

To this end, FIGS. 7 and 8 show a circuit for demodulating an FM signal incorporating suitable control of the reference voltage $V_R$. As shown in FIG. 7, a frequency modulated signal 15 is passed from a tape head 16, though an amplifier and filter 17 and a limiter 18, and to a demodulator 19, which is shown in more detail in FIG. 8.

The demodulator 19 consists of a charge pump, which operates in substantially the same way as that shown in FIG. 4 relating to the modulator. For each cycle of input 20, transistor $T_4$ passes a charge Q dependent on the values of capacitor $C_2$ is then $QfR_2$, where f is the frequency of input 20, and the circuit transfer, i.e. the ratio of input frequency to output voltage, can be controlled by varying the reference voltage $V_R$.

The demodulator 19 can be made to respond to both edges of the input waveform either by frequency doubling or by use of two demodulators in anti-phase.

The output of the demodulator 19 passes through filters 21 and a control loop 22 is included to adjust the value of voltage $V_R$ until the demodulated output is zero. The control loop 22 includes a low-pass filter 23, to enable modulation to pass through, and an amplifier 24.

The control loop may only be used for a.c. modulation, so that alternative methods of adjustment of $V_R$ may be necessary for d.c. modulation.

One such method may be to transmit carrier only at one or more positions on the tape, and at this position (or positions) to adjust the value of $V_R$ for zero output (or a fine predetermined value of output). Analogue or digital means may be used to hold the required value of $V_R$. This method could be used for d.c. modulation at any fixed tape speed and could be used repetitively, once for each change of speed, or infrequently for a range of speeds, and suitably computed from measured data for each new speed.

An alternative simple method of adjusting the value of $V_R$ in the demodulator may be to transmit carrier only during, and for a time after, any change in speed. Adjustment of $V_R$ could be made whilst carrier only was being received, and this would also remove any error in the modulator carrier frequency.

Additional binary scaling may also be used in the demodulator, as used in the modulator described herein or the demodulator described in copending patent application no. 8613167.

In both the modulator and demodulator, when d.c. signals are transmitted, it may be preferable to dedicate a channel to providing timing signals to indicate when the zero adjustment is being implemented. It may be preferable to send this timing signal via the tape, thereby avoiding complications due to tape delay, especially at low speeds.

I claim:

1. A circuit for generating a frequency-modulated signal indicative of data to be recorded onto magnetic tape, said circuit including charge storage means, means for charging said charge storage means in dependence on an input voltage, means for discharging said charge storage means, means for sensing the speed of said tape, means for varying the amount by which said charge storage means is discharged in dependence on the sensed tape speed, and means for generating an output signal of frequency dependent on the voltage across said charge storage means, said frequency being indicative of said sensed tape speed.

2. A circuit as claimed in claim 1 wherein said means for varying the amount by which said charge storage means is discharged is arranged to vary a voltage level to which said charge storage means is discharged.

3. A circuit as claimed in claim 1 and including means for performing binary division of the frequency of said output signal, in dependence on a selected tape speed.

4. A circuit as claimed in claim 1 wherein said means for varying the amount by which said charge storage means is discharged is manually operable.

* * * * *